(12) United States Patent
Kalburge

(10) Patent No.: US 7,858,454 B2
(45) Date of Patent: Dec. 28, 2010

(54) SELF-ALIGNED T-GATE CARBON NANOTUBE FIELD EFFECT TRANSISTOR DEVICES AND METHOD FOR FORMING THE SAME

(75) Inventor: Amol M. Kalburge, Springfield, VA (US)

(73) Assignee: RF Nano Corporation, Newport Beach, CA (US)

( * ) Notice: Subject to any disclaimer, the term of this patent is extended or adjusted under 35 U.S.C. 154(b) by 149 days.

(21) Appl. No.: 12/182,099

(22) Filed: Jul. 29, 2008

(65) Prior Publication Data

US 2009/0032804 A1 Feb. 5, 2009

Related U.S. Application Data

(60) Provisional application No. 60/952,966, filed on Jul. 31, 2007.

(51) Int. Cl.
 *H01L 29/12* (2006.01)
(52) U.S. Cl. .................. 438/151; 438/195; 438/196; 438/199; 438/587; 438/591; 257/346; 257/24; 257/E29.069; 257/E21.051
(58) Field of Classification Search .................. 257/24, 257/E29.069, E21.051, 346; 438/151, 195, 438/196, 199, 587, 591
See application file for complete search history.

(56) References Cited

U.S. PATENT DOCUMENTS

| | | | |
|---|---|---|---|
| 6,821,911 B1 | 11/2004 | Lo | |
| 6,891,227 B2 | 5/2005 | Appenzeller | |
| 6,962,839 B2 | 11/2005 | Wei | |
| 2002/0126195 A1* | 9/2002 | Fujii et al. | 347/112 |
| 2003/0178617 A1* | 9/2003 | Appenzeller et al. | 257/20 |
| 2004/0036128 A1* | 2/2004 | Zhang et al. | 257/401 |

OTHER PUBLICATIONS

Li et al, J. Vac. Sci. Technol. B 22(6), 3112 (2004).
Le Louarn et al, Applied Physics Letters 90, 233108 (2007).
Javey et al, Nano Letters 5(2), 345 (2005).
Javey et al, Nano Letters 4(7), 1319 (2004).
PCT Notification of Transmittal of the International Search Report, and the Written Opinion of the International Searching Authority, or the Declaration (PCT Rule 44.1), Jan. 30, 2009, 11 pages.
PCT Notification of Transmittal of the International Search Report, and the Written Opinion of the International Searching Authority, or the Declaration (PCT Rule 44.1), Jan. 30, 2009, 12 pages.

* cited by examiner

*Primary Examiner*—Wael M Fahmy
*Assistant Examiner*—Marc Armand
(74) *Attorney, Agent, or Firm*—Greenberg Traurig LLP; Bradley D. Blanche

(57) ABSTRACT

A method is provided for forming a self-aligned carbon nanotube (CNT) field effect transistor (FET). According to one feature, a self-aligned source-gate-drain (S-G-D) structure is formed that allows for the shrinking of the gate length to arbitrarily small values, thereby enabling ultra-high performance CNT FETs. In accordance with another feature, an improved design of the gate to possess a "T"-shape, referred to as the "T-Gate," thereby enabling a reduction in gate resistance and further providing an increased power gain. The self-aligned T-gate CNT FET is formed using simple fabrication steps to ensure a low cost, high yield process.

10 Claims, 5 Drawing Sheets

Figure 1:
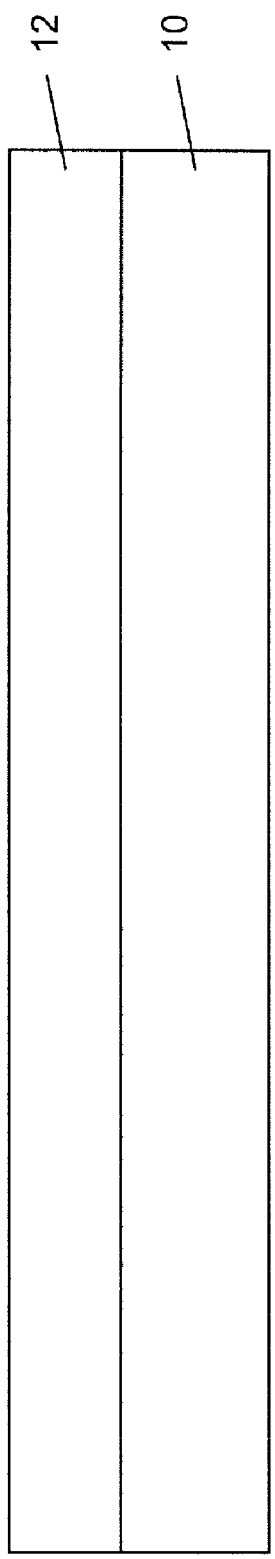

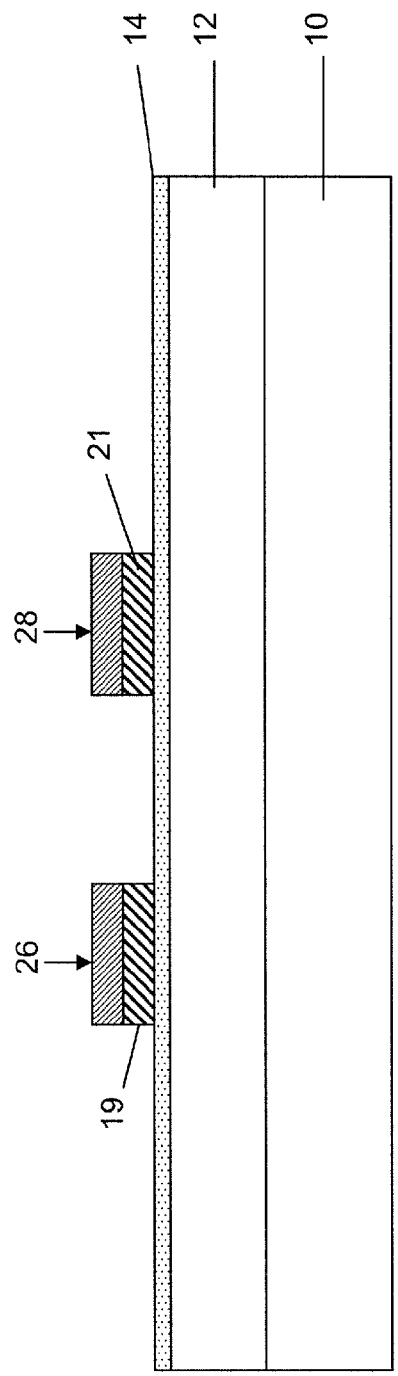
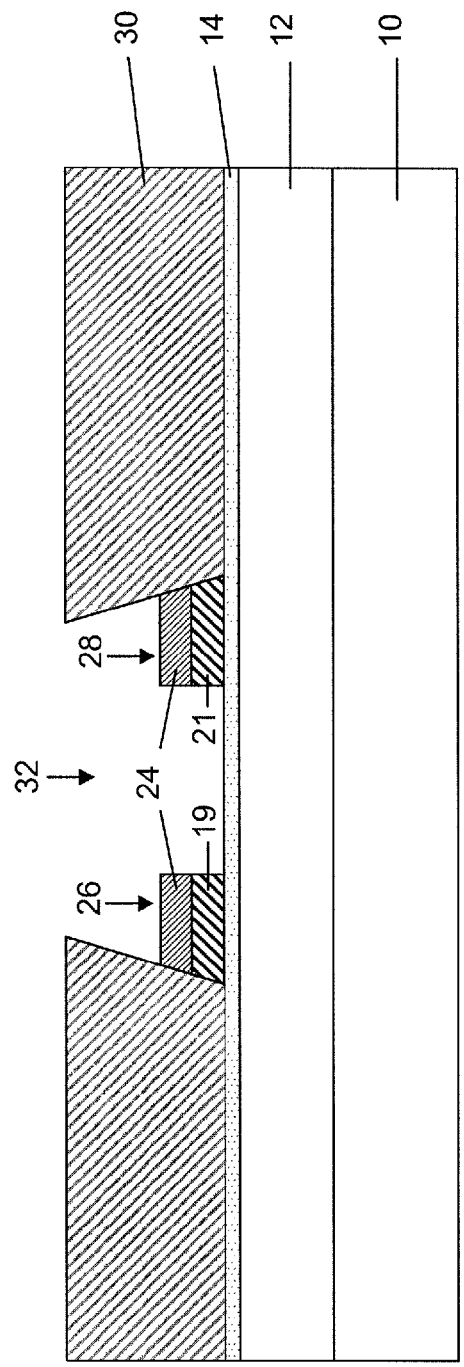

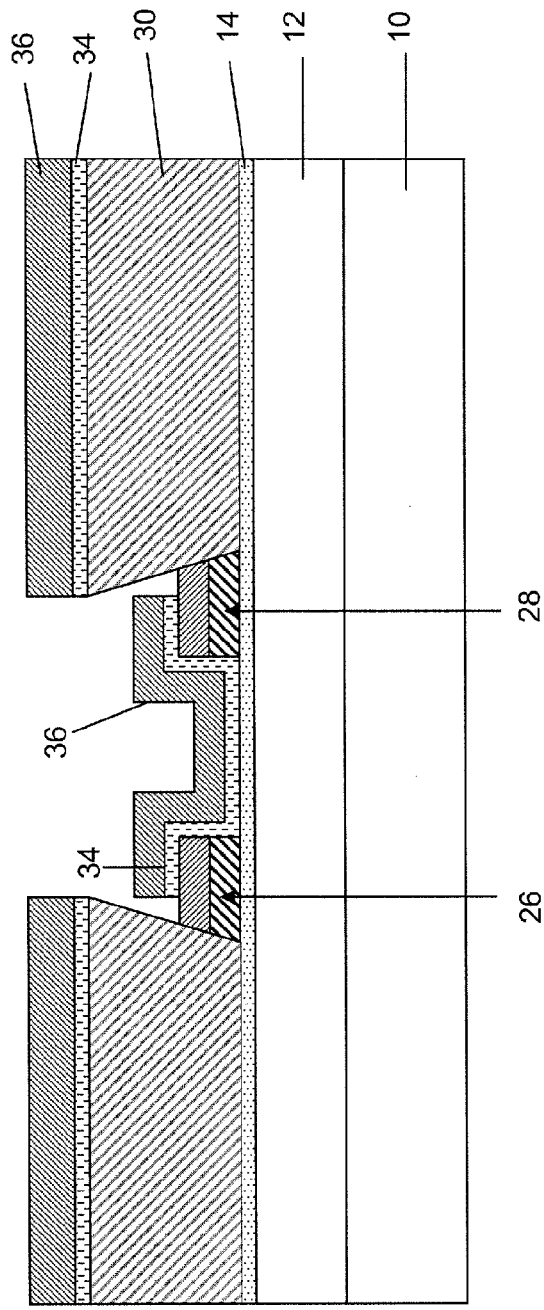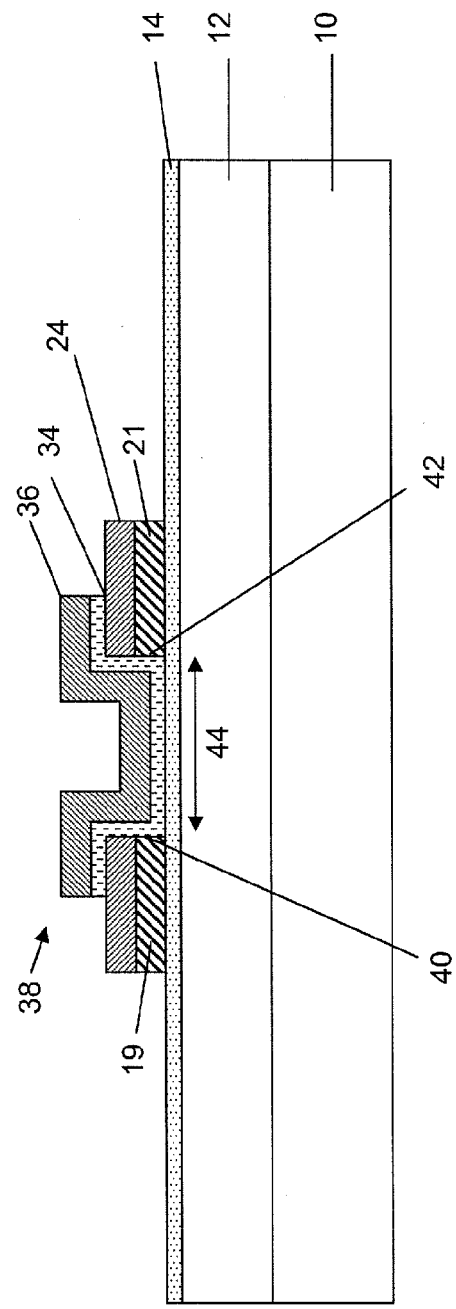

SELF-ALIGNED T-GATE CARBON NANOTUBE FIELD EFFECT TRANSISTOR DEVICES AND METHOD FOR FORMING THE SAME

RELATED APPLICATION

This application claims the benefit of and priority to U.S. Provisional Application Ser. No. 60/952,966, filed Jul. 31, 2007, the contents of which are incorporated by reference herein in its entirety.

TECHNICAL FIELD

This disclosure relates to nanotube (NT) field effect transistors (FETs), and more particularly to a self-aligned T-gate carbon nanotube field effect transistor (CNT FET).

BACKGROUND

One of the challenges facing broad commercialization of nanotube technology is the lack of a clear path for integrating carbon nanotubes (CNTs) with field effect transistors (FETs). As process geometries for FETs continue to decrease, it is becoming increasingly more difficult to manufacture FETs on a large scale to have with consistent and uniform characteristics across all FETs and even more difficult to integrate CNTs into such FETs of decreasing dimensions.

SUMMARY

According to one or more embodiments, a self-aligned T-gate carbon nanotube (CNT) field effect transistor (FET) is provided along with a method for forming the same.

In one or more embodiments, the method includes depositing a layer of carbon nanotubes (CNT) over a semiconductor substrate upon which at least one FET is to be formed. A resist layer is then deposited over the CNT layer and patterned using lithography procedures to form source and drain regions. A metal layer is deposited at least in the source and drain regions to serve as the source and drain of the FET followed by the deposition of a dielectric material over the metal layer. The resist layer is then removed to define source/drain islands over the CNT layer. Another resist layer is then deposited over the entire structure patterned using lithography procedures that are carefully controlled to open a window in the resist layer defining a gate region that does not extend beyond the source and drain islands. A gate dielectric layer is then deposited at least in the exposed gate region followed by a gate metal layer to form a self-aligned T-shaped gate ("T-gate"). The T-gate extends over the CNT layer along a gate length extending between the source/drain islands, along a side surface of each of the source/drain islands, and over respective portions of the top surfaces of the source/drain islands that are exposed in the patterned resist layer. The resist layer is then removed to form the self-aligned T-gate CNT FET.

In one or more embodiments, by forming the CNT FET to include the T-shaped gate in this manner, the gate length (i.e., the distance between the source and drain) can be reduced to the minimal distances achievable according to the process geometries being used while optimizing gate resistance and capacitance characteristics of the CNT FET. By shrinking the gate length to an arbitrarily small value, an ultra-high performance CNT FET is provided while the improved T-shape of the T-gate enables a reduction in gate resistance through the increased overall width of the entire gate electrode possessing the T-shape, thereby providing improved power gain. In one or more embodiments, the self-aligned nature of the T-gate CNT FET requires fewer lithography steps than traditional FET fabrication processes to provide a low cost, high yield process for manufacturability.

DRAWINGS

The above-mentioned features of the present disclosure will become more apparent with reference to the following description taken in conjunction with the accompanying drawings wherein like reference numerals denote like elements and in which:

FIGS. 1-9 illustrate a method of forming a self-aligned T-gate carbon nanotube (CNT) field effect transistor (FET) in accordance with one or more embodiments of the present disclosure.

DETAILED DESCRIPTION

The present disclosure is directed to a self-aligned T-gate carbon nanotube (CNT) field effect transistor (FET) and method for forming the same.

In one or more embodiments described herein, for ease of description, nanotubes may be described as a layer of carbon nanotubes (CNTs), while it is understood that the nanotubes may comprise any type of nanotubes, including but not limited to carbon nanotubes (CNTs), single walled nanotubes (SWNTS) and multiwalled nanotubes (MWNTs). Further, each of the various embodiments could also be implemented in any 1-D semiconductor device (e.g., nanotubes, nanowires, etc.) or 2-D semiconductor device (e.g., graphene-based devices, etc.).

In accordance with one or more embodiments, a method is provided for forming a self-aligned T-gate carbon nanotube (CNT) field effect transistor (FET). Referring now to FIGS. 1-8, various process steps are illustrated in accordance with one or more embodiments of forming a CNT FET with a self-aligned source-gate-drain (S-G-D) structure.

Figure 2:
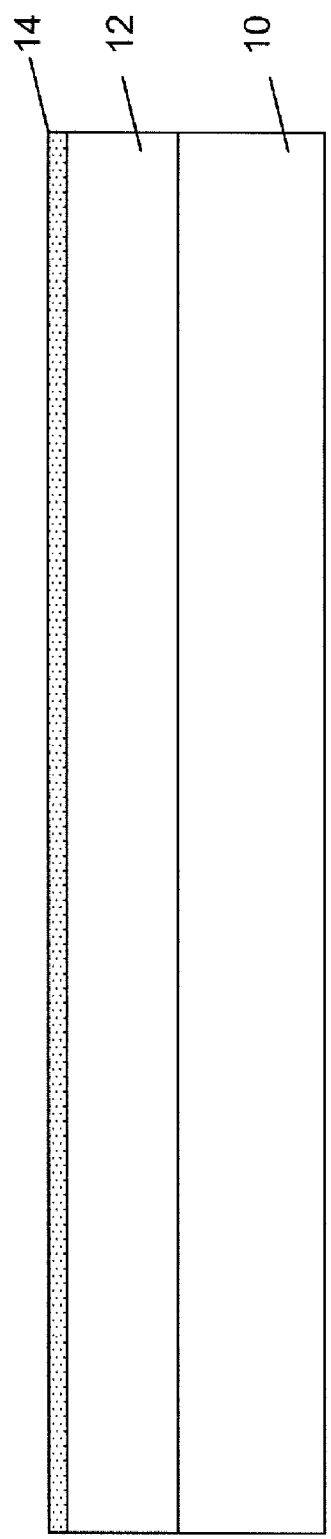

A starting substrate is initially provided, for example by forming an oxide layer 12 a layer of silicon 10, as illustrated in FIG. 1. It is understood that the starting substrate may comprise any other type of substrate upon which a FET can be formed, such as but not limited to silicon, silicon on insulator, stacked silicon on insulator, SiGe on insulator, stacked SiGe on insulator or any other semiconductor substrate 10 on which the oxide layer 12 is formed. Oxide layer 12 may be formed using thermal oxidation, CVD deposition, chemical oxidation or other oxide formation techniques. A layer of carbon nanotubes (CNT) 14 is then deposited on the oxide layer 12 using an appropriate nanotube synthesis technique, as illustrated in FIG. 2.

Figure 3:
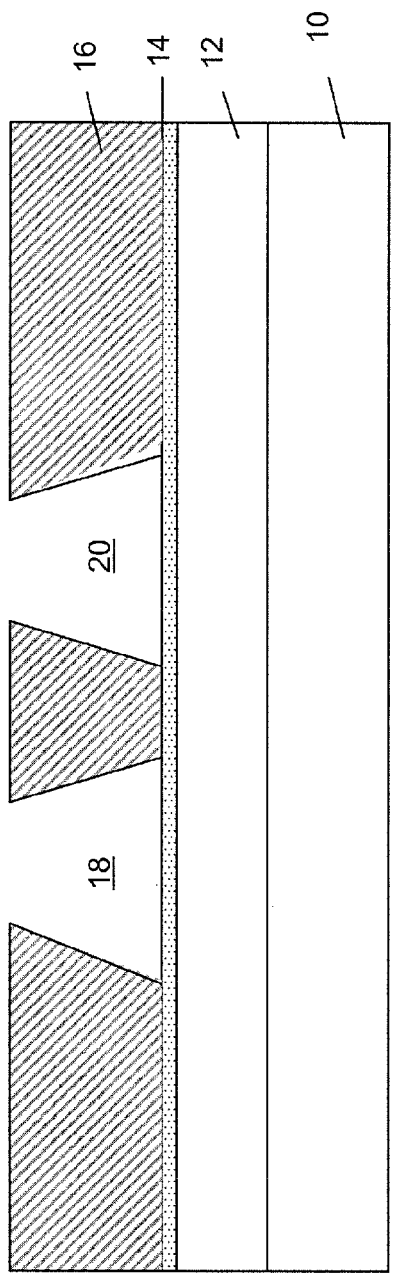
Figure 4:
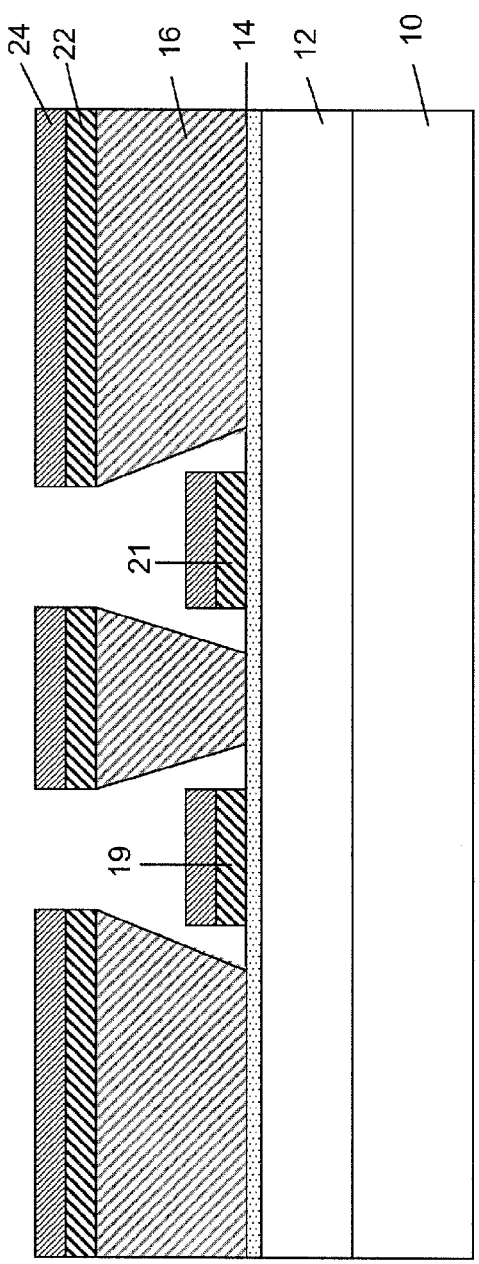
Figure 9:
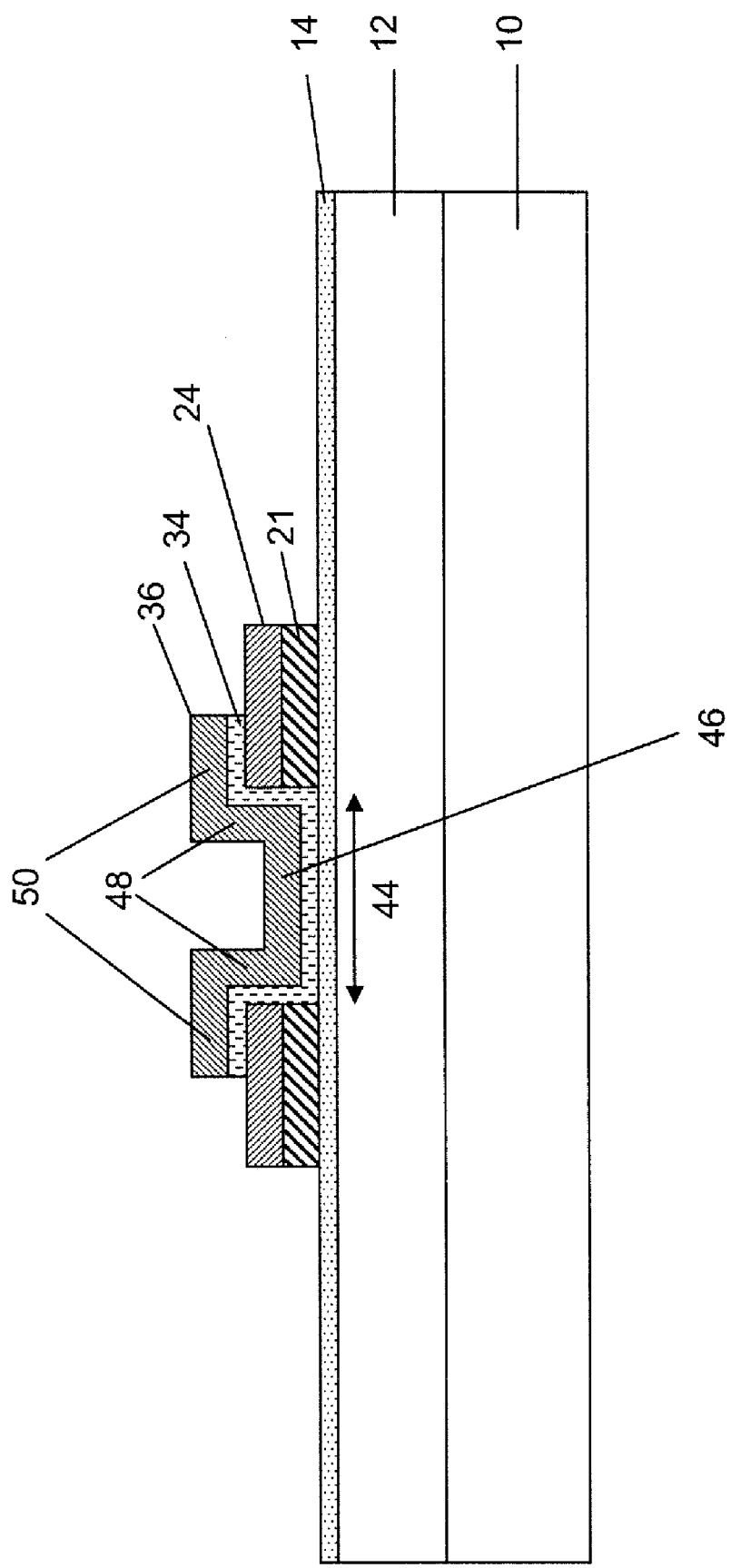

A layer of photoresist 16 is then deposited over the CNT layer 14 and patterned using conventional lithography procedures to form source and drain regions 18 and 20 over the CNT layer 14, as illustrated in FIG. 3. Referring now to FIG. 4, a metal layer 22 or other conductive material is deposited over at least portions of the structure formed thus far so that the metal layer 22 is formed in the source and drain regions 18 and 20 on the CNT layer 14 to serve as the source 19 and drain 21 of the FET. The deposition of the metal layer 22 is followed by the deposition of a dielectric over at least those portions of the metal layer 22 forming the source 19 and drain 21. In one or more embodiments, the dielectric spacer material 24 may comprise SiNx, a different type of oxide or any other dielectric material. The photoresist layer 16 is then lifted off, as illustrated in FIG. 5, to define source and drain islands 26 and 28.

In one or more embodiments, another layer of photoresist 30 is then deposited over the structure of FIG. 5 and patterned using conventional lithography procedures to open a window defining a gate region 32, as illustrated in FIG. 6. The alignment tolerance should be carefully controlled to ensure that the window of the gate region 32 that is formed in the photoresist 30 does not fall outside of the source and drain islands 26 and 28. In one or more embodiments, the alignment tolerance is further carefully controlled to ensure that the window of the gate region 32 exposes substantially equal portions of both the source island 26 and the drain island 28.

In one or more embodiments, a gate dielectric layer 34 is then deposited over at least portions of the structure of FIG. 6 so that the gate dielectric layer 34 is at least formed to extend into the gate region 32 and over exposed portions of the source and drain islands 26 and 28 and the CNT layer 14 extending between the source and drain islands 26 and 28, as illustrated in FIG. 7. Any suitable gate dielectric material may be used for gate dielectric layer 34 including but not limited silicon dioxide, silicon nitride, silicon oxinitride or other metal oxide, metal nitride or metal silicate dielectrics having a high-K value. A gate electrode layer 36 is then deposited over the gate dielectric layer 34 so that it is at least deposited over the gate dielectric layer 34 formed in the gate region 32. In one or more embodiments, the gate electrode layer 35 is formed over the gate dielectric layer 34 formed over the exposed portions of the source and drain islands 26 and 28 and the CNT layer 14 extending between the source and drain islands 26 and 28. The gate electrode layer 36 may comprise a metal (e.g., aluminum, tungsten, tantalum, platinum, molybdenum, etc.), polysilicon or any other conducting material known to those skilled in the art in the formation of gates. In some embodiments, the gate dielectric layer 34 and gate electrode layer 36 may be formed over the entire upper surface of the structure, as illustrated in FIG. 7, for ease of manufacturability of the formation process.

By carefully controlling the alignment tolerance of the window of the gate region 32, a carefully positioned window is provided that allows the formation of a self-aligned gate 36. Further, the deposition of the gate dielectric 34 further allows for the formation of the self-aligned gate 36 that is simply deposited over the gate dielectric 34. By combining the deposition of the gate dielectric 34 and the gate metal 36, a masking step is eliminated from conventional baseline FET processes, thereby providing a reliable, reproducible method of manufacturing a CNT FET having a self-aligned T-gate 36.

In one or more embodiments, the photoresist layer 30 is then lifted off, as illustrated in FIG. 8, to form the self-aligned T-gate CNT FET 38. The gate 36 is referred to as a "T-gate" based upon it being generally "T"-shaped geometry (or otherwise referred to as a "U-shape" with winged side sections that extend over the source and drain islands 26 and 28) as illustrated in FIG. 8. The gate 36 is preferably formed to extend over the over the top of substantially equal lengths of portions of the source and drain islands 26 and 28, where the gate 36 further extends adjacent to the respective side surfaces 40 and 42 of the source and drain islands 26 and 28 and also extends over the gate length 44 extending between the source 19 and drain 21.

In one or more embodiments, the self-aligned nature of this CNT FET 38 allows for the shrinking of the gate lengths 40 to arbitrarily small values, thereby boosting performance. In operation of the CNT FET 38, a controllable current can be established between the source 19 and drain 21 electrodes by a voltage applied to a T-gate electrode 36 that is positioned over the CNT layer 14 and semiconductor substrate 10 between the source 19 and drain 21 electrodes. The performance of the CNT FET 38 is determined by its size and performance parameters. By minimizing the gate length 40 between the source 19 and drain 21 electrodes, the performance and functionality of the CNT FET 38 can be maximized for high frequency and high speed performance. The gate length 40 can be formed to be the minimal distance achievable with the process tools being utilized for the process geometries being utilized to form the CNT FET 38 (e.g., 90 nm processes may yield a 90 nm gate length 40 while 0.35 micron processes may yield a 0.35 micron gate length 40, and such forth for any process technology).

It should be noted that the electrical resistance and capacitance of the gate electrode 36 are also important factors in the performance of the CNT FET 38. Merely reducing the gate length 40 to an arbitrarily small value would normally increase the resistance of the gate electrode 36, because the resistance of the gate electrode 36 increases as its length decreases. The CNT FET 38 formed in accordance with one or more embodiments herein is able to achieve the smallest possible gate length 40 between the source 19 and drain 21 electrodes while still reducing the resistance of the gate electrode 36 by forming a specially-shaped T-gate 36 that actually has an increased overall gate width. The T-shape of the T-gate 36 allows reduced gate resistance by providing an overall gate width that exceeds the gate length 40, wherein the overall gate width includes a base gate portion 46 of the T-gate 36 substantially extending over the gate length 44 between the source 19 and drain 21, side gate portions 48 that extend from the base gate portion 46 adjacent to the respective side surfaces 40 and 42 of the source and drain islands 26 and 28, and overlying gate portions 50 that extend from the side gate portions 48 to extend over the over the top of substantially equal lengths of portions of the source and drain islands 26 and 28, as further illustrated in FIG. 9. The length of overlying gate portions 50 that extend over portions of the source and drain islands 26 and 28 should be selected as appropriate for a given application to balance the gate electrical capacitance with respect to the source 19 and drain 21 electrodes with the gate electrical resistance. In some embodiments, the side gate portions 48 are formed to be substantially perpendicular with respect to both the base gate portion 46 and the overlying gate portions 50.

In one or more embodiments, the improved T-gate CNT FET 38 will thus provide power gain that will be much larger than conventional non-self-aligned and non-T-gate CNT FET architectures. Due to the "T" nature of the gate design, any increase in gate capacitance can be controlled to be minimal compared to gains made in reducing gate resistance in the T-gate 36.

Also due to self-aligned nature of the overall source-drain-gate (S-G-D) structure of the T-gate CNT FET 38, the S-G-D structure will always be fixed, thereby significantly reducing the device to device variation during manufacturing of such CNT FET 38 devices. This is especially beneficial on larger scale manufacturing processes for uniformity between the devices. Further, in one aspect, the simplicity of the design and the steps involved in forming the self-aligned T-gate CNT FET will allow high yields to be achieved in manufacturing. For example, only a single photolithography process is required to form the source and drain islands 26 and 28 and then only a single photolithography process is required to form the T-gate 36 having a fixed relationship with respect to the source and drain islands 26 and 28. In contrast, many prior art FET non-self-aligned processes have involved multiple photolithographic patterning steps to form both the source and drain regions and also to form the gate structures. Such photolithographic processes require precise alignment of photomasks with respect to one another, and misalignment of photomasks in the patterning processes can cause misalignment of the components of the S-G-D structure. Thus, by requiring only a single photolithographic patterning process to form the T-gate 36 and also a single photolithographic patterning process to form the source and drain islands 26 and 28, the chances for errors and unreliability due to misalignment of the photomasks is reduced compared to conventional techniques requiring multiple photolithographic patterning steps.

Further, the formation of a self-aligned T-gate CNT FET in accordance with one or more embodiments of the present disclosure provide numerous benefits over conventional non-self-aligned processes. When the spacing between the source and the drain, i.e. the gate length, is wider than the gate electrode width in conventional non-self-aligned processes, the spacing between gate electrode and source (or drain) electrode tends to be variable due to misalignment between photolithographic steps for the formation of the source-drain and the gate electrode. Furthermore, when the gate length is wider than the gate electrode, then the gate length cannot be reduced to the smallest possible distance for a given process technology (e.g., 0.35 um) because, at best, the width of the gate electrode can only be shrunk to the smallest possible distance for a given process technology, where the gate length would have to be wider than that distance. Still further, reducing the width of the gate electrode to the smallest possible distance for a given process technology would give rise to increase in the gate electrode resistance. Also, because the spacing between the gate electrode and source (and drain) electrodes is variable in conventional non-self-aligned processes, the capacitance (Cgd or Cgs) also varies depending on misalignment photolithographic processes used to build the non-self-aligned structure. Thus, the formation of a self-aligned T-gate CNT FET in accordance with one or more embodiments of the present disclosure overcomes many of these problems associated with conventional non-self-aligned processes and offers several performance and manufacturability benefits over such non-self-aligned structures. In the present self-aligned T-gate CNT FET, the capacitance (Cgd or Cgs) can be more precisely controlled in a consistent manner based on the fixed S-G-D structure and the gate length can be reduced to the smallest possible distance for a given process technology, while still reducing the gate electrode resistance, to increase performance of the CNT FET.

As can be seen from the foregoing, a method is provided for forming a self-aligned CNT FET capable of achieving high speed and power for CNT FETs without compromising on the manufacturability (i.e., yield) of the process.

While the system and method have been described in terms of what are presently considered to be specific embodiments, the disclosure need not be limited to the disclosed embodiments. It is intended to cover various modifications and similar arrangements included within the spirit and scope of the claims, the scope of which should be accorded the broadest interpretation so as to encompass all such modifications and similar structures. The present disclosure includes any and all embodiments of the following claims.

The invention claimed is:

1. A method, comprising:
   depositing a layer of nanotubes over a substrate;
   forming a source and a drain over the layer of nanotubes;
   forming a self-aligned gate over the layer of nanotubes between the source and the drain by:
      depositing a resist layer over the layer of nanotubes, source and drain;
      patterning the resist layer to expose an open window in a gate region over portions of the source and the drain and the layer of nanotubes extending between the source and the drain;
      forming a gate dielectric layer over at least the exposed portions of the source and the drain and the layer of nanotubes extending between the source and the drain; and
      forming a gate electrode layer over the gate dielectric layer, wherein the gate dielectric layer and the patterned resist layer serve to self-align the gate with respect to the source and the drain,
   wherein the self-aligned gate includes an overall width greater than a gate length distance between the source and the drain over the layer of nanotubes.

2. The method of claim 1, further comprising forming the source-drain-gate (S-D-G) structure in a carbon nanotube (CNT) field effect transistor (FET).

3. The method of claim 1, further comprising forming the gate to include:
   a base gate portion extending over the layer of nanotubes that substantially extends between the source and the drain;
   side gate portions extending from both ends of the base gate portion and extending adjacent to respective side surfaces of the source and the drain; and
   overlying gate portions extending from respective side gate portions and extending over respective portions of the source and the drain.

4. The method of claim 1, wherein the source and drain are formed using a single photolithography patterning process.

5. The method of claim 1, wherein the self-aligned gate is formed using a single photolithography patterning process.

6. The method of claim 1, further comprising forming the gate length between the source and the drain as the smallest possible distance achievable for the process geometry being used.

7. The method of claim 1, further comprising patterning the resist layer to expose the open window over substantially equal portions of the source and the drain.

8. The method of claim 1, further comprising controlling the patterning of the resist layer to ensure that the exposed open window does not extend outside of the source and the drain.

9. The method of claim 1, further comprising forming the gate dielectric layer and the gate electrode layer over the non-patterned portion of the resist layer deposited over the layer of nanotubes, source and drain at the same time as the gate dielectric layer and the gate electrode layer are formed over the exposed portions of the source and the drain and the layer of nanotubes extending between the source and the drain.

10. The method of claim 9, further comprising removing the resist layer.

* * * * *